United States Patent [19]

Larson

[11] 4,366,223

[45] Dec. 28, 1982

[54] PROCESS OF FORMING PERMANENT OPTICAL LAMINATION OF COLOR PROOFS

[76] Inventor: Gerald W. Larson, P.O. Box 33427, St. Paul, Minn. 55133

[21] Appl. No.: 241,511

[22] Filed: Mar. 9, 1981

Related U.S. Application Data

[63] Continuation-in-part of Ser. No. 76,823, Sep. 19, 1979, abandoned.

[51] Int. Cl.³ .......................... G03F 9/00; G03C 7/00; G03C 11/12
[52] U.S. Cl. .................................. 430/143; 156/239; 156/240; 156/277; 430/12; 430/15; 430/257; 430/293; 430/358
[58] Field of Search ................... 430/12.15, 293, 257, 430/143, 358; 156/277, 239, 240

[56] References Cited

U.S. PATENT DOCUMENTS

| | | | |
|---|---|---|---|
| 1,145,143 | 7/1915 | Ives | 430/293 |
| 3,136,637 | 6/1964 | Larson | 430/293 |
| 3,144,333 | 8/1964 | Waldherr | 430/257 |
| 3,389,029 | 6/1968 | Forman et al. | 156/277 |
| 3,671,236 | 6/1972 | Van Beusckom | 430/293 |
| 3,721,557 | 3/1973 | Inoue | 430/293 |
| 4,258,125 | 3/1981 | Edhlund | 430/293 |
| 4,260,673 | 4/1981 | Krech | 430/143 |

FOREIGN PATENT DOCUMENTS 51-109967  9/1976  Japan ............................ 156/277

*Primary Examiner*—Charles L. Bowers, Jr.

[57] ABSTRACT

Image color faithfulness can be improved by permanent lamination of the individual proofing sheets. Color proofing sheets are used with transparent, colorless adhesive on the backside of the sheets.

5 Claims, No Drawings

PROCESS OF FORMING PERMANENT OPTICAL LAMINATION OF COLOR PROOFS

This application is a continuation-in-part of Ser. No. 76,823, filed Sept. 19, 1979, abandoned.

FIELD OF THE INVENTION

The present invention relates to overlay color lithographic half-tone pre-press proofs and a process for laminating them. In particular, the present invention relates to constructions and processes which improve the faithfulness of color reproduction in overlay color pre-press half-tone proofs such as those used in lithography, gravure printing, and letter presses.

BACKGROUND OF THE INVENTION

Overlay proofs are extremely useful to the printing industry. They provide a means for predicting the quality of the printed image which is to follow. Overlay proofs are made by sequentially and separately forming single color proof images and laying them one over another in register. This provides a proof of the final printed image.

The use of individual color proof images in forming the composite has distinct advantages. The proof of each color can be viewed, and corrections of single colors can be readily made. The proofs can also be used in pairs to judge two colors, or in threes to compare 3 color proofs. On the other hand, the separation of color onto individual films produces an adverse effect on the total color rendition. The overlay sheets produce a shift in apparent color rendition in which the topmost colors are relatively dominant and the lower colors relatively weakened. This effect apparently is in part due to the multiple resin and air interfaces between the sheets which exhibit large differences in refractive indices.

Some printers have found it useful to temporarily laminate the four color proof films together by applying a non-adhesive liquid, such as water, between the films. This helps reduce the color rendition problems, but is messy and can produce spotty color variations if the liquid does not form a continuous coating or leaves by evaporation. The use of solvent type liquids can also produce other problems such as smearing the half-tone images. The volatile solvents would have more of a tendency for spotting and the more viscous, oil-like solvents would be very messy.

SUMMARY OF THE INVENTION

The use of a non-tacky, activatable polymeric adhesive layer between the color proof sheets has been found to reduce or remove color rendition variations caused by air resin interfaces. The resin binds the backside of one proofing layer to the imaged side of another proofing layer without smearing the image. The resin is carried on the back of one of the proofing layers and may be present before imaging. The adhesive may be activated by heat or appropriate solvents.

DETAILED DESCRIPTION OF THE INVENTION

Multilayer overlay color proofs are permanently laminated by optically clear adhesive layers to remove air resin interfaces between the layers. This could be effected by laying preformed films of activatable adhesive between imaged proof sheets or by having activatable adhesive layers bonded to the back (non-imaged) side of color proof layers, and then activating the adhesive to bond the color proof layers together in register. However, the use of adhesive layers bonded to the back side of the color proofs layers provides much greater convenience and consistently better laminates. In comprising an imaged non-laminated color proof to be laminated four color proof for differences in gloss, the non-laminated proof gave a reading of 160 units whereas the laminated proof gave a reading of 88 units (on a Hunter Laboratory Glossimeter). Each color proof layer (except possibly the top layer) comprised a transparent polymeric backing and a half-tone image on one side thereof.

There are generally four color proofing layers, one each of yellow, magenta, cyan, and black. The half-tone image on these layers may be formed by any of the many available processes and compositions known to the art. Either positive or negative processes, or additive or substractive processes and compositions may be used. Either pigments or dyes may be used as the coloring material. Particularly good imaging systems are disclosed in U.S. Pat. Nos. 3,211,553 and 3,136,637. Both of these systems would produce color proofing layers comprising a polymeric film carrier having bonded thereto a diazo resin (i.e., an oligomeric diazonium resin), and over the diazo resin a pigmented polymer overlayer. Other systems known in the art use diazo resins in the pigmented binder layer. These systems may also be improved according to the present invention.

The transparent, polymeric carrier layer may be made of suitable transparent polymeric materials. Organic polymer films are most preferred. Such resins as polyesters (e.g., polyethyleneterephthalate), cellulose esters (e.g., cellulose acetate butyrate), polyacrylates (e.g., polymethylmethacrylate), and vinyl resins are particularly desirable. The films must have good structural integrity which usually means they are at least about 0.5 mils ($1.25 \times 10^{-5}$ m) in thickness, up to a maximum determined mainly by reasonableness, such as 5 mils ($1.25 \times 10^{-4}$ m); although greater film thicknesses can be used a preferred range is between 0.75 ($1.88 \times 10^{-5}$ m) and 3 mils ($7.62 \times 10^{-5}$ m).

The transparent activatable adhesive layer may be any of a great number of known adhesives. The adhesive must be transparent and colorless, however, and must also be generally non-tacky before activation. For example, pressure-sensitive adhesives would not be useful. Those would make it difficult to place the proofs in register and, during the process of sticking and then unsticking proofs together, they would remove part of the image layers on other sheets. The adhesive film layer should be continuous over the image area or at least flow when activated to form a continuous coating over the carrier layer. The adhesive may be activatable by suitable means, for example, radiation, heat, or solvent. If the adhesive layer is solvent-containing or solvent-activatable, it should not contain or require only solvents which would dissolve or swell the image layer when placed in contact therewith. Such activatable transparent adhesives would include polymeric coatings of polyacrylates, polyvinyl resins, polyamides, polyesters, copolymers of each of these, or blends of these materials.

The process of laminating these sheets together requires the separate exposure and development of each of the four color proof layers with the adhesive on the backside of at least three and preferably four of the layers. After formation of the images, the sheets are positioned in register and are laminated together. The lamination may be done one sheet at a time, with one layer preferably being laminated to a substrate, or all four layers may be laminated together, and preferably to a substrate, at one time, as by heating all of the color proofs with heat-activatable adhesives on the back side of each proof.

These and other aspects of the present invention will be further shown in the following examples. All percentages are by weight unless otherwise specified.

EXAMPLE 1

Four separate color proofing layers (of yellow, magenta, cyan, and black) were formed according to Example 5 of U.S. Pat. No. 3,136,637. On the back side of each proofing layer was coated 200 mg/ft$^3$ of a composition having 70 parts by weight of vinyl terpolymer (about 91% vinyl chloride, 3% vinyl acetate, and 6% vinyl alcohol), 30 parts by weight poly(butylmethacrylate), and 3 parts fumed silica particles (Cab-O-Sil ® H-5, Cabot Corp.). The resins were dissolved in methyl ethyl ketone, and then the silica was added and dispersed in a colloid mill. The silica in the formulation added a degree of slip to the adhesive layers so that they could be adjusted easily.

The individual constructions were exposed to the appropriate color separations and processed according to U.S. Pat. No. 3,136,637. They were then mounted in register on white paper with the image side down in the order of yellow, magenta, cyan, and black. They were secured in register by a tape on one edge only. At this point, an undesirable color shift could be noted in the proofs. The sheets were then lifted from each other and a small quantity of n-propanol was sprayed onto the adhesive coated back of the three lower layers. All four sheets were then allowed to return to their original positions and lightly squeesed to remove any excess alcohol from the interface and to bind the activated adhesive to the sheet above. The adhesive resin back coat absorbed enough solvent to develop a firm adhesion between the layers. This bond remained even after the solvent was lost by diffusion and/or evaporation.

Color rendition was greatly improved after lamination, and the glare was reduced.

EXAMPLE 2

The construction of the previous example was repeated except that the adhesive layer comprised polybutylmethacrylate in methyl ethyl ketone at a coating weight of 500 mg/ft$^2$ solids. The finished proofs with this adhesive coating on the back sides of the bottom three layers were secured in register by a tape and then passed between a pair of heated squeeze rollers. One of the rollers was maintained at 190° F., and the secured proofs were passed slowly enough through the rollers to insure softening of the acrylate adhesive layer. The acrylic coating softened into a highly transparent single sheet with no color rendition loss apparent after lamination.

What is claimed is:

1. A process for forming a laminated, imaged, color proofing sheet comprising individually exposing four separate color proofing sheets to imagewise distributed radiation, each sheet comprising a radiation sensitive layer on a transparent carrier layer of between $1.25 \times 10^{-5}$ and $1.25 \times 10^{-4}$ m with at least three of said sheets having transparent, non-tacky, non-pressure-sensitive, activatable adhesive layers on the back side of said carrier layers, said adhesive layers having been applied prior to said exposing steps, removing a portion of said radiation sensitive layer to leave a color halftone image comprising a dye or a pigment in a polymeric binder on each of said sheets, placing said sheets in register with said adhesive layers of said at least three sheets being positioned between adjacent carrier layers, and activating the activatable adhesive to laminate said four sheets together.

2. The process of claim 1 wherein said proofing sheets are laminated together one at a time.

3. The process of claim 1 wherein all four proofing sheets are laminated together at the same time.

4. The process of claim 3 wherein an opaque substrate is laminated to said four proofing sheets at the same time that the four proofing sheets are laminated together.

5. The process of claim 1 wherein said separate color proofing sheets have a diazonium resin between said polymeric binder and the carrier layer.

* * * * *